(12) United States Patent
Jacobsen et al.

(10) Patent No.: US 9,377,567 B1
(45) Date of Patent: Jun. 28, 2016

(54) SELF-FORMING DIFFRACTION GRATINGS

(71) Applicant: HRL LABORATORIES, LLC, Malibu, CA (US)

(72) Inventors: Alan J. Jacobsen, Woodland Hills, CA (US); Oleg M. Efimov, Thousand Oaks, CA (US); William Carter, Calabasas, CA (US); Sophia S. Yang, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 164 days.

(21) Appl. No.: 13/918,711

(22) Filed: Jun. 14, 2013

Related U.S. Application Data (60) Provisional application No. 61/778,248, filed on Mar. 12, 2013.

(51) Int. Cl.
*G02B 5/18* (2006.01)

(52) U.S. Cl.
CPC ............... *G02B 5/1847* (2013.01); *G02B 5/18* (2013.01)

(58) Field of Classification Search
CPC .......... G02B 1/04; G02B 5/18–5/1895; G02B 27/42–27/46; G03B 2001/026; G03H 1/0272; G03H 1/04; G03H 2222/20; G03H 2222/22; G03H 2222/34; G03H 2222/53; G03H 2223/24; G03H 2250/39

USPC ............... 359/1, 3, 9, 10, 11, 15, 28, 35, 359/558–576; 427/492, 508

See application file for complete search history.

(56) References Cited

U.S. PATENT DOCUMENTS

| 5,822,089 | A * | 10/1998 | Phillips et al. ............ 359/3 |
| 7,127,138 | B2 | 10/2006 | Efimov et al. |
| 7,382,959 | B1 | 6/2008 | Jacobsen |
| 7,864,388 | B2 | 1/2011 | Effimov |

OTHER PUBLICATIONS http://www.arborsci.com/Data_Sheets/33-0980_DS.pdf, "Holographic Diffraction Gratings," 2009, 2 pages.

Close et al., "Monomer diffusion rates in photopolymer material. Part I. Low spatial frequency holographic gratings," J. Opt. Soc. Am. B, 28(4):658-666, Apr. 2011.

Jeong et al., "Reaction-controlled diffraction grating of photopolymer for use of phase stable holographic optical element," Applied Physics Letters, 98:101103, 2011, 4 pages.

Matsumoto, "Free-Radical Crosslinking Polymerization and Copolymerization of Multivinyl Compounds," Advances in Polymer Science, 123: 42-80, 1995.

(Continued)

*Primary Examiner* — Derek S Chapel
*Assistant Examiner* — Adam W Booher
(74) *Attorney, Agent, or Firm* — Lewis Roca Rothgerber Christie LLP (57) ABSTRACT

A diffraction grating and a method for fabricating the diffraction grating. In one embodiment, a layer of photo-monomer is applied to a substrate and the photomonomer is exposed to a collimated beam of light to form the diffraction grating. The intensity of the collimated beam of light incident on the layer of photo-monomer may have substantially no spatial variation across the first collimated beam of light.

13 Claims, 8 Drawing Sheets

(56) References Cited

OTHER PUBLICATIONS

Mazzulla et al., "Surface relief gratings on polymer dispersed liquid crystals by polarization holography," Applied Physics Letters, 85(13):2505-2507, 2004.

Zhao et al., "Formation of surface relief gratings with homeotropically oriented photopolymer from a photocross-linkable organic monomer," Phys. Chem. Chem. Phys., 12:1436-1439, 2010.

* cited by examiner

Images taken from center of diffraction pattern outward

SELF-FORMING DIFFRACTION GRATINGS

CROSS-REFERENCE TO RELATED PATENTS

This application claims priority to and the benefit of Provisional Application No. 61/778,248, filed Mar. 12, 2013, entitled "SELF-FORMING DIFFRACTION GRATINGS", the entire content of which is incorporated herein by reference.

FIELD

The present invention relates to diffraction gratings and methods of fabricating the diffraction gratings, and more particularly to self-forming diffraction gratings and methods of fabricating the diffraction gratings by illuminating photo-monomer film with collimated light of substantially uniform intensity.

BACKGROUND

Existing methods of fabricating diffraction gratings are generally costly, requiring for example a source of patterned light or a master pattern, or a mechanical cutting apparatus suitable for cutting closely spaced grooves in a piece of glass. Moreover, several existing techniques are poorly suited to continuous fabrication and instead require a batch process, which may also increase cost. Certain fabrication methods require high precision equipment, which may have exacting alignment requirements or a need for regular tuning and calibration.

Thus, there is a need for an inexpensive, simple method for fabricating diffraction gratings.

SUMMARY

The present invention relates to a method for fabricating diffraction gratings. In one embodiment, a photomonomer film is applied to a reflective surface on a substrate, and illuminated from an angle with collimated light of a wavelength suitable for initiating polymerization reactions in the photomonomer film.

According to an embodiment of the present invention there is provided a method for fabricating a diffraction grating, the method including: applying a layer of photo-monomer to a substrate; and generating a diffraction grating in the layer of photo-monomer by polymerizing the layer of photo-monomer. Here the generating of the diffraction grating includes: exposing the photo-monomer to a first collimated beam of light wherein the intensity of the first collimated beam of light incident on the layer of photo-monomer has substantially no spatial variation across the first collimated beam of light.

In one embodiment, the layer of photo-monomer is substantially transparent to the light.

In one embodiment, the substrate is a reflective substrate.

In one embodiment, the reflective substrate is a mirror.

In one embodiment, the thickness of the layer of photo-monomer is greater than 1 micron and less than 1 mm.

In one embodiment, the first collimated beam of light is oblique to the substrate.

In one embodiment, the method further includes applying a transparent cover plate to the layer of photo-monomer, before exposing the photo-monomer to the first collimated beam of light.

In one embodiment, the method further includes removing the substrate.

In one embodiment, the method further includes exposing the layer of photo-monomer to a second collimated beam of light.

In one embodiment, the second collimated beam of light is oblique to the substrate.

In one embodiment, the first collimated beam of light from the first collimated light source is incident directly on the layer of photo-monomer; the substrate is transparent to the second collimated beam of light from the second collimated light source; and the second collimated beam of light from the second collimated light source is incident on the layer of photo-monomer after passing through the substrate.

In one embodiment, the first collimated beam of light from the first collimated light source is incident directly on the layer of photo-monomer; the substrate is transparent to the second collimated beam of light from the second collimated light source; and the second collimated beam of light from the second collimated light source is incident on the layer of photo-monomer after passing through the substrate.

According to an embodiment of the present invention there is provided a method of fabricating an optical structure having index of refraction variations in a radial pattern, the method including: applying a layer of photo-monomer to a substrate; generating a diffraction grating by polymerizing the layer of photo-monomer, wherein the generating of the diffraction grating includes: providing a source of conically diverging light; and exposing the layer of the photo-monomer to a conically diverging beam of from the source of conically diverging light.

According to an embodiment of the present invention there is provided a planar optical structure including: a diffraction grating having a plurality of first bands of high-refractive-index polymeric material, alternating with a plurality of second bands of low-refractive-index polymeric material, the first bands of high-refractive-index polymeric material and the second bands of low-refractive-index polymeric material extending in a first direction, the index of refraction profile along a second direction perpendicular to the first direction being quasi-periodic, with a period greater than 1 micron and less than 100 microns, wherein the standard deviation, taken along a line parallel to the second direction, of the separation, in the second direction, between adjacent high-refractive-index points and low-refractive-index points is greater than 5% of the period of the index of refraction profile, the thickness of the structure in a third direction perpendicular to the first and second directions being greater than 1 micron and less than 1 mm.

In one embodiment, three bands connect at a branch-merge node.

In one embodiment, the structure includes a plurality of branch-merge nodes including the branch-merge node, the branch-merge nodes distributed in an irregular pattern within the structure.

According to an embodiment of the present invention there is provided a method for fabricating a diffraction grating, the method including: applying a layer of photo-monomer to a substrate and generating a diffraction grating in the layer of photo-monomer by polymerizing the layer of photo-monomer, wherein the generating of the diffraction grating includes exposing the photo-monomer to a first collimated beam of light, and wherein the substrate is a mirror.

BRIEF DESCRIPTION OF THE DRAWINGS

These and other features and advantages of the present invention will be appreciated and understood with reference to the specification, claims and appended drawings wherein:

DETAILED DESCRIPTION

The detailed description set forth below in connection with the appended drawings is intended as a description of exemplary embodiments of self-forming diffraction gratings provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention.

Embodiments of the present invention include a novel method for fabricating a polymer optical diffraction grating, e.g., a polymer film with a patterned modulation in the refractive index. This method and the resulting diffraction grating differ in important respects from other, existing methods for fabricating diffraction gratings and the diffraction gratings formed by these methods. An optical diffraction grating may also be referred to as a diffraction grating and may be, for example, a surface relief diffraction grating, or a photopolymer diffraction grating.

A diffraction grating produces a modulation in the phase delay of light on transmission through the diffraction grating or on reflection from the diffraction grating. There are various approaches to achieve a modulated phase delay. These generally fall into one or both of two categories: methods that produce a patterned surface relief, and methods that produce a pattern in the bulk index of refraction of the diffraction grating material. Diffraction gratings may generally be formed by mechanical methods or methods using illumination with patterned light, or combinations of these techniques.

Surface relief diffraction gratings have a textured surface consisting of peaks and valleys. Diffraction occurs because of the refractive index difference between the "peaks", which are comprised of a solid material (typically a polymer or glass), and the "valleys" or voids that contain air. As such the optical delay experienced by light transmitted through the diffraction grating is greater at the peaks than in the valleys because light travels more slowly in the material of the diffraction grating than in air. The optical delay experienced by light reflected from the diffraction grating is greater at the valleys than at the peaks, because the distance to the reflecting surface is greater in the valleys. The pitch, e.g., the distance between two peaks, will affect the diffraction angles of wavelengths (actually, this is the diffraction pattern) that will be diffracted and the depth of the valleys and the shape of the peaks and valleys will affect the diffraction efficiency.

One method of fabricating surface relief diffraction gratings involves applying a film of photoresist to a glass substrate, exposing the film to a pattern of light, and developing the film, i.e., removing the portions that were not exposed, or the portions that were exposed, to form the surface relief diffraction grating. The pattern of light may be produced either by illuminating the film through a mask or by generating a holographic pattern or other interference pattern. This process is comparatively expensive, especially in the case of large area diffraction grating production, and may suffer from restrictions in the feasible diffraction grating sizes that can be achieved. Another approach is to perform an etching step in which the glass is etched where not protected by the photoresist. The photoresist may then be removed entirely. Yet another method of fabricating a surface relief diffraction grating involves cutting groves, i.e., valleys, into a piece of glass by mechanical means.

Low-cost embossed surface relief diffraction gratings can be fabricated using a precision master mold having the appropriate surface relief profile. Such a precision master may be fabricated using the methods described, e.g., using photoresist which is exposed and developed, and optionally followed by an etching step and a step to remove the photoresist, or using mechanical cutting techniques. Such master molds, and masks used during the illumination of photoresist, may also be referred to as master patterns.

Several techniques may be used to form diffraction gratings from photopolymers, which may be referred to as photopolymer diffraction gratings. Photopolymer diffraction gratings can be fabricated by exposing a film of photomonomer to patterned light. Multiple mechanisms and approaches may result in a modulated refractive index in a polymer film based on the light pattern during exposure. Depending on the exposure technique and the materials utilized, the diffraction effect in the photopolymer diffraction gratings is attributed to either a surface texture that is formed during polymerization, or a modulation in the refractive index, e.g., due to a variation in crosslink density, or phase-separation, or both.

One approach, referred to as polarization holography, involves a photomonomer-liquid crystal mixture that will begin to phase-separate during exposure to a modulated polarization state. A similar technique involves exposing a film of photomonomer to non-polarized light directed through a mask, creating a patterned light intensity. A surface relief diffraction grating is generated as a result of mass transport of monomer from the shaded regions to the irradiated, i.e., exposed, regions of the polymer film. In yet another technique, the exposure light pattern is generated by interference between two mutually coherent beams generated from a laser. The interference may be produced, for example, using a Michelson-type interferometer arrangement.

Embodiments of the present invention may be used to fabricate a diffraction grating without using any master pattern, resulting in lower fabrication costs, as no precision lithographic equipment is necessary, and in rapid throughput, as the films may be formed in seconds with minimal post-processing required. Moreover, certain characteristics of the diffraction gratings formed according to embodiments of the present invention may be tailored at little cost. The method may be used to make large area diffraction films over curved surfaces, and unique, identifiable features which are formed into the diffraction grating in the fabrication process may be used as security markings that cannot be easily replicated.

Figure 1:
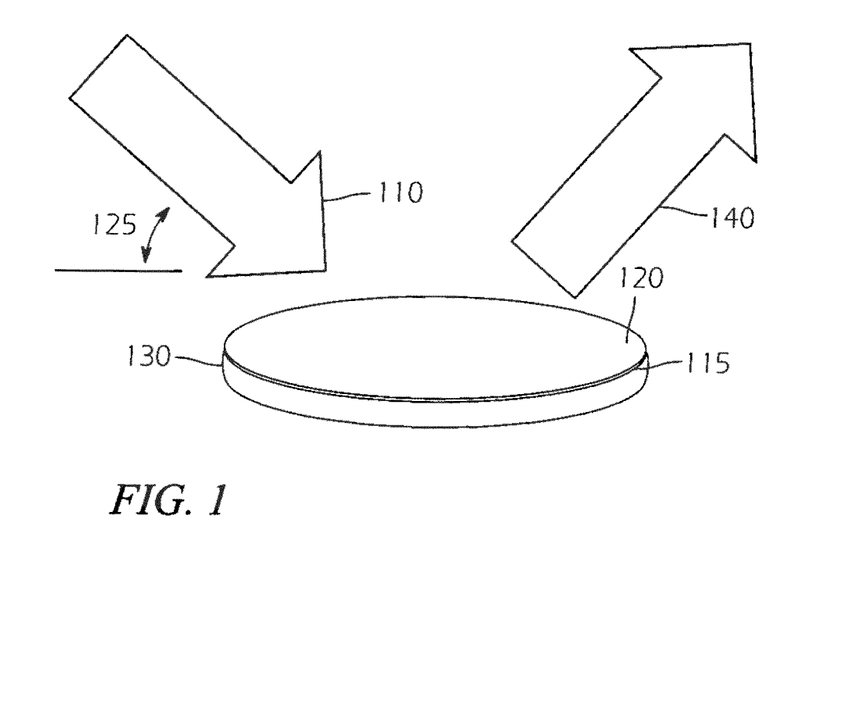
FIG. 1 is a perspective view of a set-up for fabricating a diffraction grating according to an embodiment of the present invention.

According to one embodiment of the present invention, an approach to forming a diffraction grating does not require a master pattern to form the diffraction grating in the polymer film, either in the form of a mask or of an embossing master, nor does the embodiment require a technique such as the use of interference or a holographic pattern that modulates the intensity or polarization of the incident light, to produce a patterned exposure pattern. Referring to FIG. 1, the diffraction grating is formed according to the principles of the present invention by the act of exposing a layer of photomonomer, which may also be referred to as a photomonomer film 120, on a reflective surface 115 to a single first collimated beam 110 of light. The first collimated beam 110 may be oblique to the substrate 130, with an incident angle 125. In embodiments of the present invention, the light does not need to be coherent or polarized.

In one embodiment illustrated in FIG. 1, the diffraction grating is formed by the act of exposing a photomonomer film 120 on a reflective surface 115 to a single first collimated beam 110 that will initiate polymerization. In one embodiment, the photomonomer will polymerize when exposed to UV light at a wavelength of approximately 365 nm, although different photoinitiators may be used to initiate polymerization when the photomonomer is exposed to other wavelengths, including wavelengths in the visible region of the electromagnetic spectrum. The reflective surface 115 may be the coated or uncoated surface of a substrate 130 also used to support the photomonomer film 120. The intensity of the reflected beam 140, which may be referred to as a secondary beam, is a function of the intensity of the first collimated beam 110, which may be referred to as the primary beam, the attenuation coefficient and thickness of the photomonomer, and the material of the substrate 130 or of its coating, if any.

The characteristics of the diffraction grating formed according to this method may depend on the intensity of the reflected beam 140, which may be selected, by controlling the factors identified above, to be between 1%-100% of the first collimated beam 110 intensity.

Figure 2:
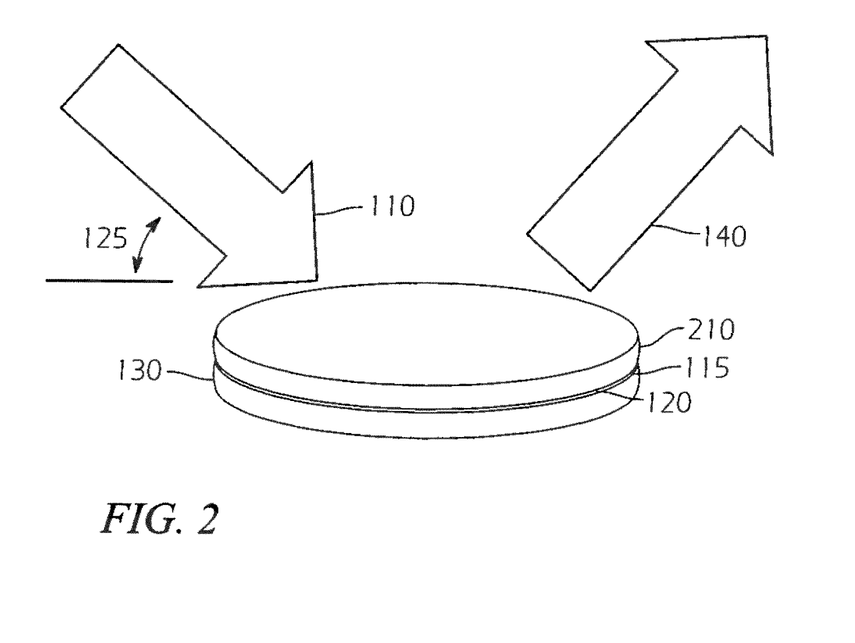
FIG. 2 is a perspective view of another set-up for fabricating a diffraction grating according to an embodiment of the present invention.

Referring to FIG. 2, in another embodiment, a photomonomer film 120 on the reflective surface 115 of a first substrate 130 is covered with a cover plate 210, that is transparent to the first collimated beam 110. A diffraction grating formed according to this method may have essentially no surface texture, and, consequently may be the result entirely of modulation in the refractive index within the material. Diffraction gratings formed according to this embodiment may benefit from the presence of the cover plate 210 if they are exposed to environmental conditions that would adversely affect the photopolymer film formed from the photomonomer film 120. In one embodiment, a diffraction grating may be fabricated between a silicon substrate and a transparent polyethylene terephthalate (PET) cover plate 210. After exposure the silicon substrate may be removed, leaving the diffraction grating adhered to the transparent PET substrate.

Figure 3:
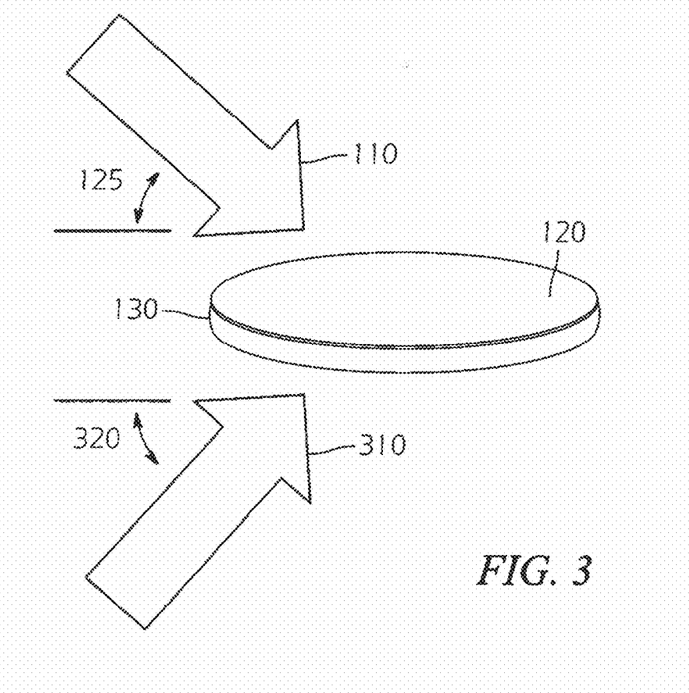
FIG. 3 is a perspective view of another set-up for fabricating a diffraction grating according to an embodiment of the present invention.
Figure 4:
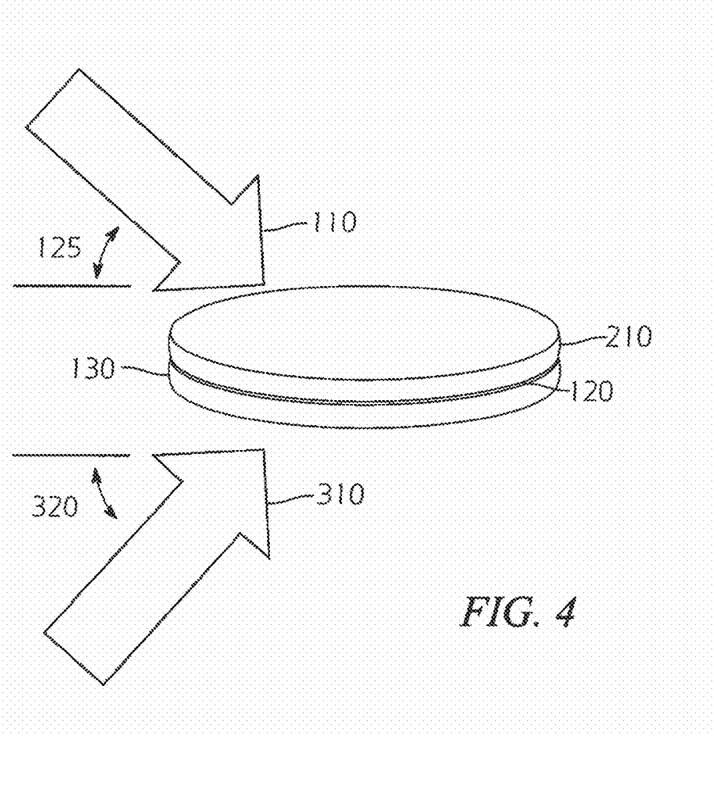
FIG. 4 is a perspective view of another set-up for fabricating a diffraction grating according to an embodiment of the present invention.

Referring to FIG. 3, in another embodiment, the photomonomer film 120 is on a transparent substrate 130 and a secondary beam is provided in the form of a second collimated beam 310 which is directed through the transparent substrate 130 at a second incident angle 320. In this embodiment the intensity of the second collimated beam 310 can conveniently be tuned independently of the intensity of the first collimated beam 110, providing an additional adjustment for, e.g., adjusting the rate of formation of a diffraction grating. Referring to FIG. 4, in a related embodiment, the method may also be practiced with a cover plate 210, positioned on top of the photomonomer film 120.

As envisioned, in embodiments of the present invention, diffraction gratings may be formed according to a mechanism described as follows. When a cross-linking photomonomer is exposed to incident energy that will initiate polymerization, the monomer may begin to preferentially polymerize, e.g., gel in localized regions, which may be referred to as microgels. This may result in highly cross-linked microdomains that are linked together by a polymer matrix with a lower cross-link density. In some instances, depending on the chemical composition of the monomer, phase separation may occur, resulting in chemical differences between the microgel regions and the surrounding polymer.

Figure 5:
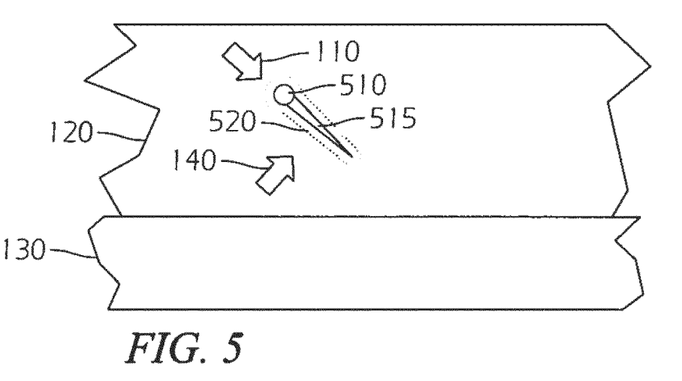
FIG. 5 is a schematic cross-sectional view showing a step in the formation of a diffraction grating by one mechanism according to an embodiment of the present invention.
Figure 6:
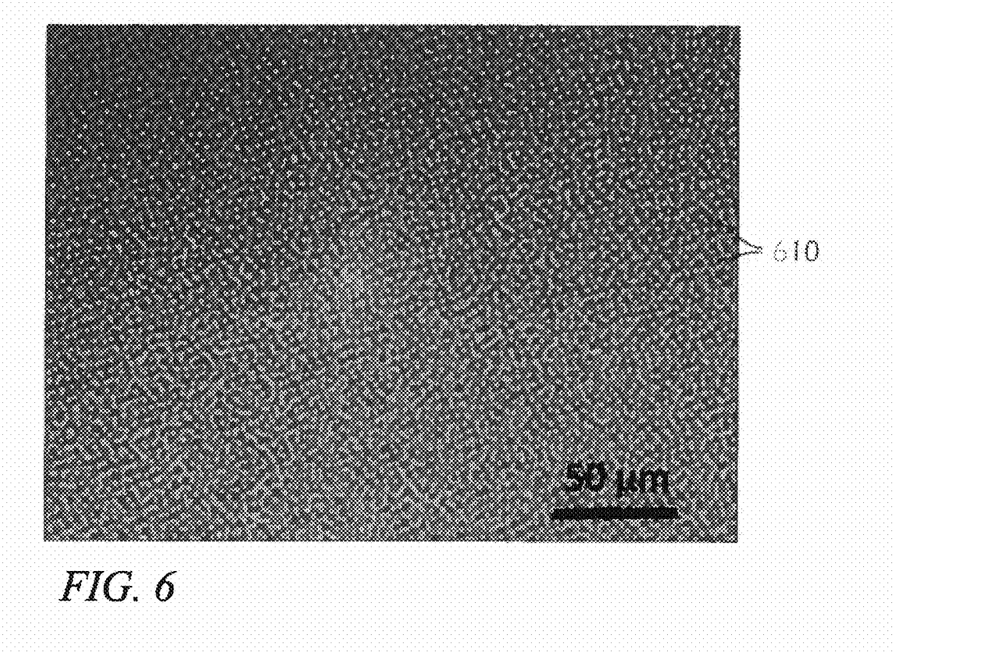
FIG. 6 is a photograph of a dotted pattern created by illumination at normal incidence according to an embodiment of the present invention.

Referring to FIG. 5, a cross sectional view of the structure in FIG. 1, initial exposure of a photomonomer film 120 to a first collimated beam 110 may initiate formation of microgel sites 510 within the liquid photomonomer layer. The microgel site 510 may have dimensions comparable to the pitch or half the pitch of the diffraction grating, e.g., 2 μm to 10 μm, and the collimated beam may have dimensions comparable to the dimensions of the grating, e.g., 10 mm or less to 50 mm or greater. As envisioned, in one embodiment, these microgel sites 510 may have a higher cross-link density than the surrounding monomer-polymer mixture 520, which leads to a higher localized refractive index. The higher refractive index at the microgel site 510 acts as a lens and the focused energy from the first collimated beam 110 leads to the formation of an initial waveguide strand 515 in the direction of the first (primary) collimated beam 110, where the refractive index of the waveguide is higher than the surrounding monomer-polymer mixture 520. In one embodiment the monomer mixture 520 is left in place, resulting in a diffraction grating relying on a modulation of the refractive index of the diffraction grating material. In another embodiment the monomer mixture 520 is washed away, resulting in a surface relief diffraction grating. Referring to FIG. 6, in one embodiment, if the incident beam is normal to the substrate, the modulation in the refractive index results in a "dotted" pattern, in which lighter dots 610 represent areas of higher refractive index.

Figure 7:
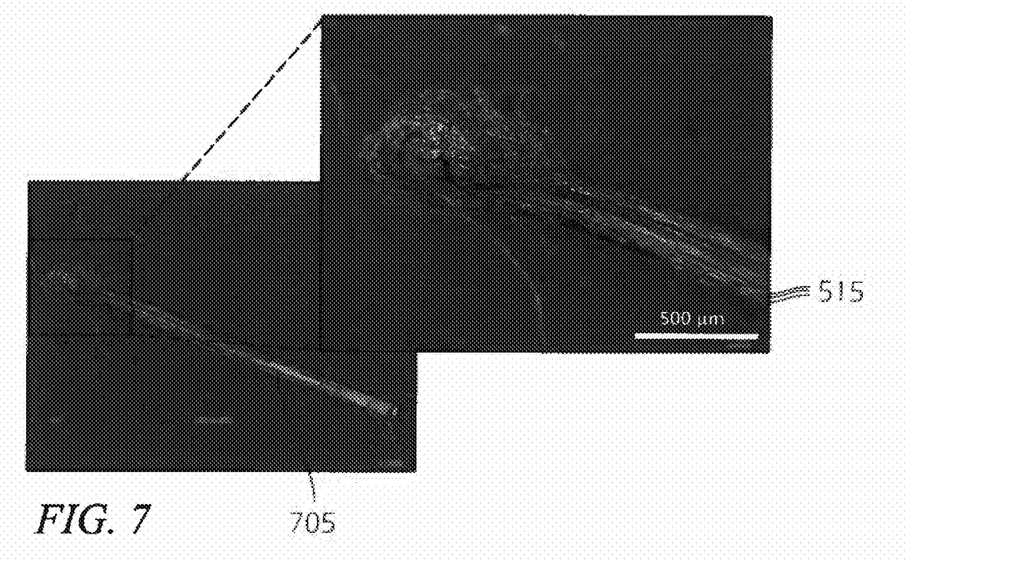
FIG. 7 is a photograph of the end of a single waveguide formed by illuminating a photomonomer reservoir through a mask pursuant to an embodiment of the present invention.

Supporting evidence of this mechanism is shown in, showing photographs of a waveguide 705 formed using the technique described in U.S. Pat. No. 7,382,959 (the "'959 patent"). The technique described in the '959 patent uses a mask and results in a different structure, but some of the mechanisms of formation are related to those of the present invention. As shown in FIGS. 7A and 7B, this waveguide 705 includes many smaller waveguide strands 515 that are bundled, or coupled together. The diameter of the waveguide 705 is defined by the exposure area, which is defined by the aperture in the photomask, and is much larger than the diameter of each individual waveguide strand 515 in the bundle. The waveguide strands 515 in the bundle may be initiated by microgel sites 510 (FIG. 5) at the exposure surface of the photomonomer. As the crosslink density accelerates within the microgel domains, the incident light forms individual waveguide strands 515 that initiate from each microgel site 510. The individual waveguide strands 515 self-propagate through the monomer and together form the waveguide 705. The waveguide 705 may continue to propagate until its length results in attenuation that slows further formation, until the exposure is terminated, or until the waveguide reaches a boundary surface of the photomonomer.

Figure 8:
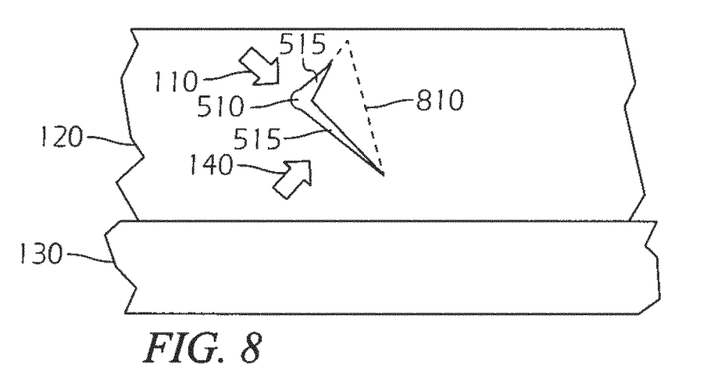
FIG. 8 is a schematic cross-sectional view showing a step in the formation of a diffraction grating by one mechanism according to an embodiment of the present invention.
Figure 9:
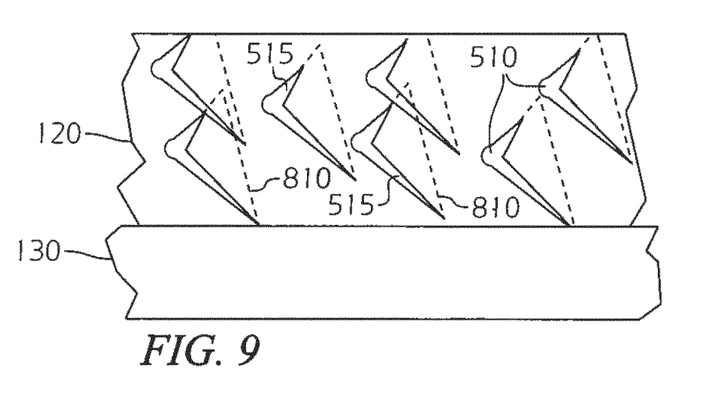
FIG. 9 is a schematic cross-sectional view showing a step in the formation of a diffraction grating by one mechanism according to an embodiment of the present invention.

Referring to FIG. 5, formation of a diffraction grating may be initiated as follows. If the incident angle 125 of the first collimated beam 110 is less than 90 degrees, the waveguide strand 515 that begins to form at each microgel site 510 will propagate in the direction of the incident light. Referring to FIG. 8, in this case, the reflected beam 140 will begin to interact with the microgel site 510 and with the initial waveguide strand 515, generating a polymerization front 810 that propagates through the photomonomer film 120 in a direction intermediate to that of the first collimated beam 110 and that of the reflected beam 140. This polymerization front 810 is the advancing edge of a planar region of polymerized material, referred to as a polymer plane. Referring to FIG. 9, a cross sectional view of the structure in FIG. 1, multiple microgel sites 510 may form substantially simultaneously, when illumination begins, and the microgel sites 510 may occur at random locations throughout the photomonomer film 120. As the two-dimensional polymer planes form in the direction of the collimated light, polymer planes that are sufficiently close to each other may merge together. Polymer planes that are too far apart to merge together may remain as planar regions with high crosslink density separated by regions with lower crosslink density. As envisioned, in one embodiment, the long-range order between the high crosslink density regions, which may have a higher refractive index, and the lower cross-link density regions which may have a lower refractive index, forms a diffraction grating.

How close polymer planes must be to merge, and the average spacing or pitch between higher refractive index regions, may depend on interaction between the direction and intensity of the primary and secondary beams, the surface texture of the substrate 130, the polymerization kinetics, and the change in the refractive index as the monomer polymerizes, both at the microgel sites 510 and in the surrounding regions.

Figure 10A:
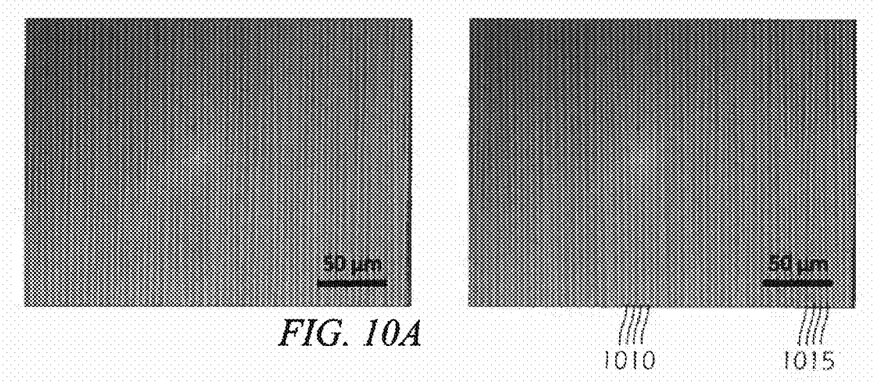
FIG. 10A is a photograph of a diffraction grating formed according to an embodiment of the present invention.
Figure 10B:
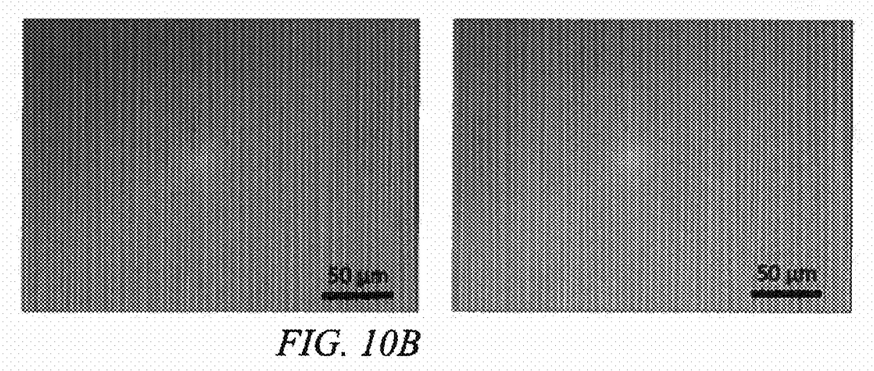
FIG. 10B is a photograph of a diffraction grating formed according to an embodiment of the present invention.
Figure 10C:
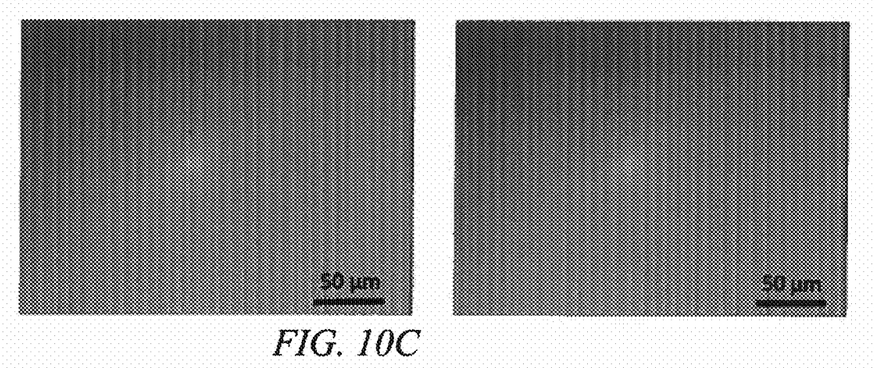
FIG. 10C is a photograph of a diffraction grating formed according to an embodiment of the present invention.

Photographs of two diffraction gratings fabricated according to an embodiment of the present invention are shown in FIG. 10A, in which the bands of high-index polymeric material 1010 appear as lines of a lighter shade than the bands of low-index polymeric material 1015. The diffraction gratings of FIGS. 10A, 10B, and 10C were fabricated on silicon substrates without a cover plate 210. The diffraction grating shown in FIG. 10B was fabricated with a larger exposure time and a smaller incident angle 125 (FIG. 1) than the diffraction grating shown in FIG. 10A. A change in the incident angle 125 may result in changed reflection from the surface of photomonomer film 120, and a change in the irradiance on the photomonomer film 120 (FIG. 1); a change in exposure time may be used to compensate for this change in irradiance. Similarly, the diffraction grating shown in FIG. 10C was fabricated with a larger exposure time and a smaller incident angle 125 than the diffraction grating shown in FIG. 10B. In one embodiment, the average pitch increases slightly as the incident angle 125 decreases and the degree of order between the higher index and lower index planes increases as the incident angle 125 decreases. The increase in the degree of order may be caused both by the decrease in incident angle 125 and the decrease in incident intensity as the angle decreases.

Figure 11:
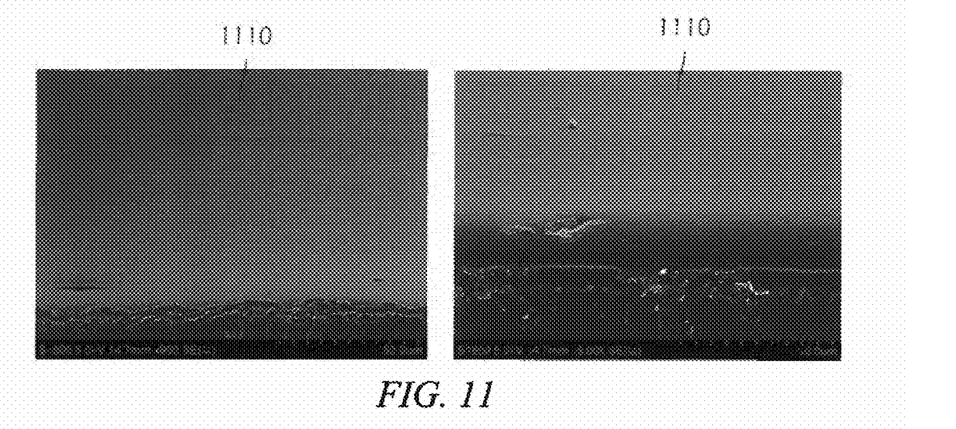
FIG. 11 shows two scanning electron microscope (SEM) images of the upper surface of a diffraction grating formed according to an embodiment of the present invention.

Referring to FIG. 11, scanning electron microscope (SEM) images of a diffraction grating fabricated, e.g., according to the embodiment of FIG. 1, on a silicon substrate, without a cover plate 210, show a smooth upper surface 1110, indicating that also in an embodiment in which the diffraction grating is fabricated without a cover plate 210, the diffraction grating is not a surface relief diffraction grating and may be inferred to have a pattern in the bulk index of refraction of the diffraction grating.

Figure 12A:
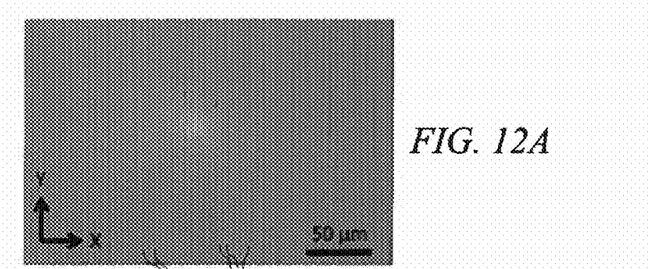
FIG. 12A is a photograph of a portion of a diffraction grating formed according to an embodiment of the present invention.
Figure 12B:
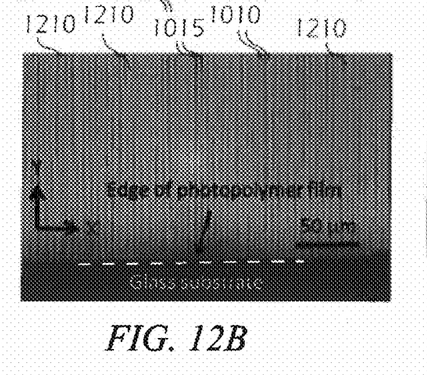
FIG. 12B is a photograph of the edge of a diffraction grating formed according to an embodiment of the present invention.
Figure 12C:
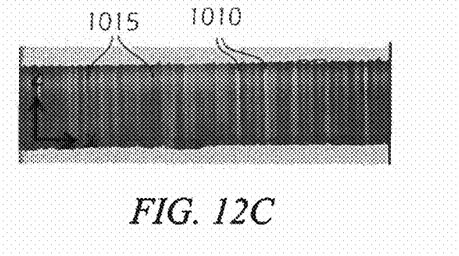
FIG. 12C is a photograph of a cross section of a diffraction grating formed according to an embodiment of the present invention.

In one embodiment, a diffraction grating fabricated using a secondary beam in the form of a second collimated beam 310 which is directed through the transparent lower substrate 130, with a transparent, optical quality cover plate 210 positioned on top of a 30 micron photomonomer film 120 (FIG. 4), may result in a diffraction grating like the one photographs of which appear in FIGS. 12A-12C. The particular diffraction grating in FIGS. 12A-12C was formed by illuminating the photomonomer film 120 for 100 seconds with two 354 nm, 1.0 mW per square centimeter, beams from an argon ion laser, each with an incident angle 125 of 30 degrees. Collimated laser light may be formed from the output of the laser using, for example, one or more suitable lenses. The cross-section in FIG. 12C of the photopolymer diffraction grating shows that the bands of high-index polymeric material 1010 and the bands of low-index polymeric material 1015 extend through the thickness of the film. As may be seen in FIGS. 12A and 12B, the diffraction grating formed according to an embodiment of the present invention may not be perfectly regular or periodic but may, for example, contain one or more points referred to as branch-merge nodes 1210 at which, in the direction of the Y axis as labeled, a band of high-index polymeric material 1010 may branch to become two bands of high-index polymeric material 1010 or, conversely, two bands of high-index polymeric material 1010 may merge to become one band of high-index polymeric material 1010. Equivalently, three bands of high-index polymeric material 1010 may be said to connect at a branch-merge node 1210, because two bands of high-index polymeric material 1010 on one side of the branch-merge node 1210 may be connected to one band of high-index polymeric material 1010 on the other side of the branch-merge node 1210. Similarly bands of low-index polymeric material 1015 may branch or merge at branch-merge nodes 1210. The diffraction grating may also differ from a perfectly regular or periodic diffraction grating in that the spacing, in the direction labeled X, between adjacent bands of high-index polymeric material 1010 may not be exactly the same for every pair of adjacent bands of high-index polymeric material 1010, but may vary, exhibiting for example a finite standard deviation.

The random nature of the deviations from uniformity displayed by diffraction gratings formed according to embodiments of the present invention may result in each diffraction grating being unique. Moreover, pieces cut from a diffraction grating made according to the present invention may be unique, differing both from each other and from pieces cut from other diffraction gratings, as a result of such random deviations from perfect regularity. This property may make such gratings useful as unique identifiers suitable, for example, for authentication.

In one embodiment, forming a diffraction grating using a first collimated beam 110 with a higher intensity may result in a diffraction grating having both higher average pitch and a larger standard deviation. Using a cover plate 210 to form the diffraction grating may further increase this effect, i.e., result in a diffraction grating having still higher average pitch and standard deviation. The effect of the cover plate 210 may be due to acceleration of the polymerization kinetics because when a cover plate 210 is used, the surface of the photomonomer film 120 is not exposed to air, the oxygen in which may act as an inhibitor of the polymerization reaction. In addition, the physical constraint of the cover plate 210 may limit mobility of the higher refractive index regions during formation, in turn leading to greater disorder.

Conversely, using a first collimated beam 110 with a low intensity may result in a diffraction grating having a low standard deviation, although below a certain intensity referred to as the polymerization threshold intensity, which may be approximately 0.75 mW per square centimeter, the photomonomer film 120 may not polymerize and no diffraction grating may be formed.

As envisioned, when a diffraction grating is formed using a first collimated beam 110 with a low intensity, the higher refractive index waveguide strands 515 and polymerization fronts 810 may be able propagate within the film prior to significant polymerization within the bands of low-index polymeric material 1015. This may lead to a lower standard deviation of the diffraction grating pitch because the delay in the polymerization of the liquid monomer between bands of high-index polymeric material 1010 allows mobility of the waveguides, leading to a "self-alignment" mechanism during polymerization. If the lower refractive index regions crosslink too quickly, the planar waveguides that begin to form from localized microgel sites 510 will not be able to merge together over large distances, i.e., distances considerably greater than the average pitch.

In another embodiment, a non-reacting or slower reacting species known to those skilled in the art may be added to the monomer mixture used to form the photomonomer film 120, to further enhance the effect described above. In this case, when exposing the monomer to the first collimated beam 110, the reacting species may diffuse to the denser polymer regions, thus reducing the concentration of the reacting species in the lower refractive index regions, which may further suppress polymerization in those regions. Delaying polymerization in the lower refractive index regions may lead to a larger modulation of the refractive index, thereby increasing the diffraction efficiency of the diffraction grating.

In another envisioned embodiment in which a cover plate 210 is not used, if the bands of high-index polymeric material 1010 are substantially crosslinked before the bands of low-index polymeric material 1015 gel, the combination of monomer and oligomer (e.g., polymer or polymer intermediate containing relatively few structural units) in the bands of low-index polymeric material 1015 may be removed with a solvent, creating a surface relief diffraction grating. Alternatively, the photopolymer diffraction grating may be "post-exposed" with non-collimated UV light or thermally post-cured after the first exposure to fix or lock the diffraction grating in the film.

In one embodiment, the chemistry of the monomer used to form the photomonomer film 120 may be selected to produce a diffraction grating with certain desired properties. For example, a liquid monomer having an index of refraction of 1.5275, and forming a polymer with an index of refraction of 1.5640, results in a smaller difference in refractive index between the bands of low-index polymeric material 1015 and the bands of high-index polymeric material 1010, and in a diffraction grating with a lower diffraction efficiency, than, for example, a liquid monomer having an index of refraction of 1.5121, and forming a polymer with an index of refraction of 1.5533, because the change in refractive index is greater in the latter system than in the former.

Figure 13:
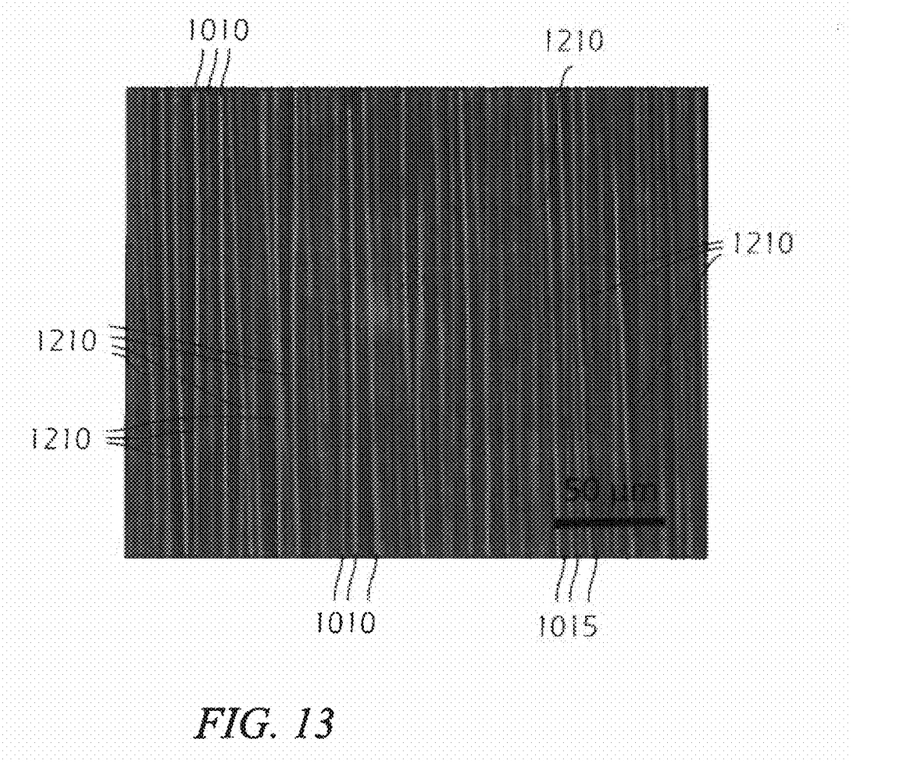
FIG. 13 is a photograph of a portion of a diffraction grating formed according to an embodiment of the present invention.

The thickness of the photomonomer film 120 may affect the characteristics of the diffraction grating formed. In one embodiment, the thickness range is between 5 and 10 times the average pitch of the diffraction grating. As the thickness decreases to less than the average pitch for a given chemistry and exposure condition, the diffraction grating may cease to form. As the thickness increases beyond 10 times the average pitch, disorder in the diffraction grating, e.g., the standard deviation of the separation between adjacent bands of high-index polymeric material 1010, may increase. In some embodiments, greater disorder may be desirable. Referring to FIG. 13, in one embodiment if a photomonomer film 120 with a thickness of 150 microns is used, a relatively high level of disorder may be present, as evidenced for example by the relatively high density of branch-merge nodes 1210.

Figure 14A:
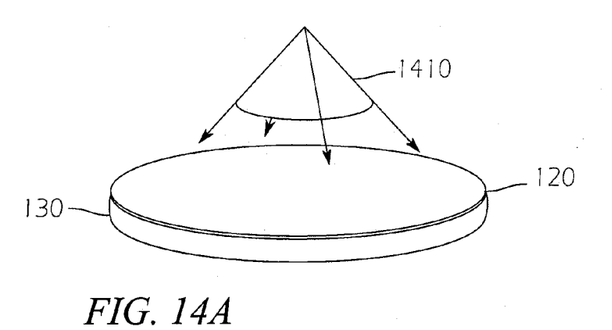
FIG. 14A is a schematic illustration of a method of forming a diffraction grating with a radial pattern according to an embodiment of the present invention.
Figure 14B:
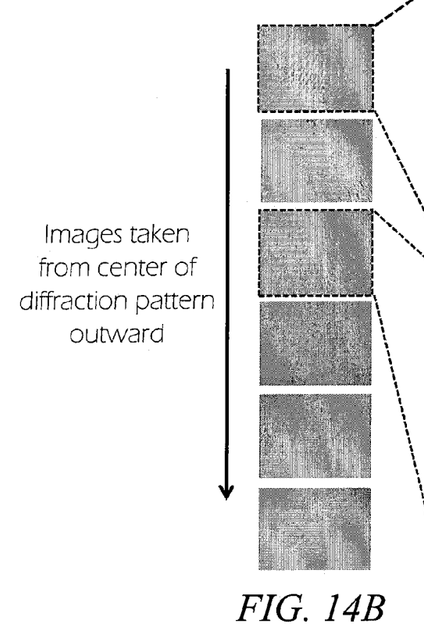
FIG. 14B shows photographs, taken at various radii, of portions of a diffraction grating formed according to an embodiment of the present invention.
Figure 14C:
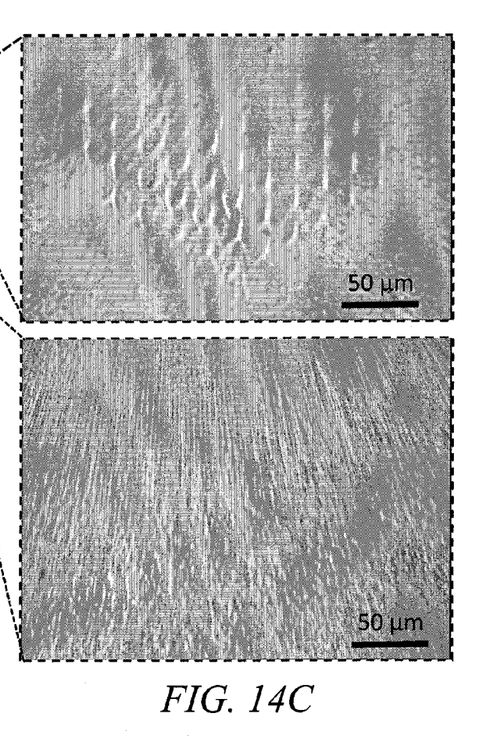
FIG. 14C shows enlargements of photographs, taken at various radii, of portions of a diffraction grating formed according to an embodiment of the present invention.

In one embodiment, multiple exposure beams that are incident on the same surface, but rotated about the normal to that surface, may be used to create grid patterns. Referring to FIG. 14A, a conical incident beam 1410 illuminating a photomonomer film 120 on a reflective surface 115 may be used to create a radial diffraction pattern, as shown in FIGS. 14B and 14C.

The table below shows the diffraction grating pitch achieved, for diffraction gratings fabricated with an incident angle of 42°, according to several different embodiments using two different monomer compositions, a first monomer composition and a second monomer composition.

| Monomer composition | Intensity (mW/cm$^2$) | Cover plate | Grating Pitch (μm) |
| --- | --- | --- | --- |
| First | 1.0 | Absent | 5.9 |
| First | 2.0 | Absent | 6.6 |
| First | 1.0 | Present | 7.7 |
| Second | 1.0 | Absent | 7.2 |
| Second | 2.0 | Absent | 7.9 |
| Second | 4.0 | Absent | 8.3 |

Because the described diffraction gratings are fabricated with a single exposure, and no alignment of any exposure pattern is necessary, the diffraction grating may in one embodiment be fabricated using a roll-to-roll continuous process, in which the diffraction grating is transported on a conveyor as it is fabricated. That is, with reference to FIG. 1, the photomonomer film 120 on a reflective surface 115 may be continuously moving in the plane of beam incidence to form an infinitely long tape with a photopolymer diffraction grating. If necessary, the tape may be "post-exposed" with non-collimated UV light, or thermally post-cured, after the first exposure to fix or lock the diffraction grating in the film.

Although embodiments of methods of forming self-forming diffraction gratings have been specifically described and illustrated herein, many modifications and variations will be apparent to those skilled in the art. Accordingly, it is to be understood that the methods of forming self-forming diffraction gratings employed according to principles of this invention may be embodied other than as specifically described herein. The invention is also defined in the following claims, and equivalents thereof.

What is claimed is:

1. A method for fabricating a diffraction grating, the method comprising:
    applying a layer of photo-monomer to a substrate; and
    generating the diffraction grating in the layer of photo-monomer by polymerizing the layer of photo-monomer,
    wherein the generating of the diffraction grating comprises:
    exposing the photo-monomer to a first collimated beam of light wherein the intensity of the first collimated beam of light incident on the layer of photo-monomer has substantially no spatial variation across the first collimated beam of light, forming polymer planes of the diffraction grating that are parallel to the direction of propagation of the first collimated beam of light, and
    exposing the photo-monomer to a second collimated beam of light.

2. The method of claim 1, wherein the layer of photo-monomer is substantially transparent to the light.

3. The method of claim 1, wherein the substrate is a reflective substrate.

4. The method of claim 3, wherein the reflective substrate is a mirror.

5. The method of claim 1, wherein the thickness of the layer of photo-monomer is greater than 1 micron and less than 1 mm.

6. The method of claim 1, wherein the first collimated beam of light is oblique to the substrate.

7. The method of claim 6, wherein the diffraction grating has index of refraction variations in the shape of a grid, wherein the second collimated beam of light is oblique to the substrate.

8. The method of claim 7, wherein
    the first collimated beam of light is incident directly on the layer of photo-monomer;
    the substrate is transparent to the second collimated beam of light; and
    the second collimated beam of light is incident on the layer of photo-monomer after passing through the substrate.

9. The method of claim 1, further comprising applying a transparent cover plate to the layer of photo-monomer, before exposing the photo-monomer to the first collimated beam of light.

10. The method of claim 9, further comprising removing the substrate.

11. The method of claim 1, wherein the second collimated beam of light is oblique to the substrate.

12. The method of claim 1, wherein
    the first collimated beam of light is incident directly on the layer of photo-monomer;
    the substrate is transparent to the second collimated beam of light; and
    the second collimated beam of light is incident on the layer of photo-monomer after passing through the substrate.

13. The method of claim 1, wherein the second collimated beam of light is not parallel to the first collimated beam of light, and wherein the polymer planes of the diffraction grating are parallel to the direction of propagation of the second collimated beam of light.

* * * * *